United States Patent
Kim (10) Patent No.: US 7,428,286 B2
(45) Date of Patent: Sep. 23, 2008

(54) DUTY CYCLE CORRECTION APPARATUS AND METHOD FOR USE IN A SEMICONDUCTOR MEMORY DEVICE

(75) Inventor: Kyung-Hoon Kim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 621 days.

(21) Appl. No.: 11/026,583

(22) Filed: Dec. 30, 2004

(65) Prior Publication Data

US 2005/0238128 A1    Oct. 27, 2005

(30) Foreign Application Priority Data

Apr. 27, 2004    (KR) .................. 10-2004-0028975

(51) Int. Cl.
*H04L 7/00* (2006.01)

(52) U.S. Cl. ............... 375/371; 375/375; 327/149; 327/150; 327/153; 327/158; 370/517; 713/503

(58) Field of Classification Search ......... 375/371–373, 375/375, 376; 327/147, 149, 150, 153–156, 327/158, 159; 370/517–519; 713/500, 503, 713/600

See application file for complete search history.

(56) References Cited

U.S. PATENT DOCUMENTS 5,614,855 A    3/1997  Lee et al.

| | | | |
|---|---|---|---|
| 6,259,326 B1 * | 7/2001 | Dunlop et al. | 331/2 |
| 6,349,122 B1 * | 2/2002 | Woodman, Jr. | 375/373 |
| 6,518,809 B1 | 2/2003 | Kotra | |
| 6,853,225 B2 | 2/2005 | Lee | |
| 6,859,081 B2 | 2/2005 | Hong et al. | |
| 6,956,418 B2 * | 10/2005 | Kwak et al. | 327/158 |
| 7,098,714 B2 * | 8/2006 | Lin | 327/291 |
| 2004/0062121 A1 | 4/2004 | Chung et al. | |

FOREIGN PATENT DOCUMENTS

JP    2004-129255 A    4/2004

* cited by examiner

*Primary Examiner*—Dac V Ha
(74) *Attorney, Agent, or Firm*—Townsend and Townsend and Crew LLP (57) ABSTRACT

The present invention is directed to a duty cycle correction apparatus that can be implemented in a small size, and is capable of performing a phase lock more rapidly, and reducing the amount of current being consumed, and to a method thereof. The duty cycle correction apparatus in accordance with the present invention for use in a semiconductor memory device includes a delay line unit for delaying a first clock signal to produce a first delayed clock signal; an output tap unit for delaying the first delayed clock signal by a pulse width of a first logic state of the first clock signal under the control of a toss control signal derived from a second clock signal; and a phase mixer for mixing the clock signal from the output tap unit and one of the first and second clock signals.

64 Claims, 7 Drawing Sheets

DUTY CYCLE CORRECTION APPARATUS AND METHOD FOR USE IN A SEMICONDUCTOR MEMORY DEVICE

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

1. Field of the Invention

The present invention relates in general to semiconductor memories, and in particular, to apparatus and method for correcting duty cycle of clock signals used in semiconductor memories.

2. Background of the Invention

Conventional duty cycle correction (DCC) technology can be classified into analogue DCC and digital DCC. Analogue DCC implementations tend to suffer from larger static current and narrower correction range for the duty cycle. On the other hand, analogue DCC typically provides higher resolution and therefore higher degree of correction, and are comparatively smaller in circuit size. In contrast, the drawbacks of the digital DCC are larger size and difficulty in significantly improving resolution. Moreover, digital DCC has a further disadvantage in that it is susceptible to noises occurring in the power supply. However, digital DCC merits are that it its static current is low, the correction process is rapid, and the correction range is wide. Due to such advantages, the digital DCC has been preferably utilized to correct clock signal duty cycle in semiconductor memory devices.

One type of digital DCC is disclosed in commonly owned copending application, U.S. Ser. No. 10/331,412, filed on Dec. 30, 2002, entitled "DIGITAL DLL APPARATUS FOR CORRECTING DUTY CYCLE AND METHOD THEREOF", which is incorporated herein by reference. In such digital DCC, two delay lock loops (DLLs) are provided for the duty cycle correction. Because the DLL circuitry is nearly doubled in size (two phase mixers, two delay model units and two direct phase detectors), this implementation consumes larger silicon area.

Further, precise synchronization requires each of the two phase mixers, the two delay model units and the two direct phase detectors in each of the two delay lock loops to have substantially identical delay regardless of variations in process, voltage, temperature, etc. In such digital DCC, however, it is a challenge to match the phases of the two clocks used for each of the two delay lock loops accurately by equalizing each delay amount of the circuit elements, i.e., the phase mixers, the delay model units and the second direct phase detectors, involved in each delay lock loop.

BRIEF SUMMARY OF THE INVENTION

The present invention provides apparatus and method for implementing duty cycle correction that consumes relatively smaller silicon area.

The present invention also provides duty cycle correction apparatus and method capable of performing a more rapid phase lock.

The present invention further provides duty cycle correction apparatus and method capable of reducing the amount of current dissipation.

In accordance with an aspect of the present invention, there is provided a duty cycle correction apparatus for use in a semiconductor memory device, the apparatus including a delay line unit for delaying a first clock signal to produce a first delayed clock signal; an output tap unit for delaying the first delayed clock signal by a pulse width of a first logic state of the first clock signal under the control of a toss control signal derived from a second clock signal; and a phase mixer for mixing the clock signal from the output tap unit and one of the first and second clock signals.

In accordance with another aspect of the present invention, there is provided a duty cycle correction apparatus for use in a semiconductor memory device including a delay line In accordance with another aspect of the present invention, there is provided a duty cycle correction apparatus for use in a semiconductor memory device including a delay line unit for delaying a first clock signal to produce a first delayed clock signal; an output tap unit for delaying the first delayed clock signal by a pulse width of a first logic state of the first delayed clock signal, under the control of a toss control signal arranged at a rising edge of a first logic state of a second clock signal which is a complementary signal of the first clock signal, to produce a delay line output clock signal arranged at a falling edge of a first logic state of the first delayed clock signal; and a phase mixer for mixing a delay line output inversion clock signal inverted from the delay line output clock signal and the first clock signal.

In accordance with another aspect of the present invention, there is provided a duty cycle correction method for use in a semiconductor memory device including the steps of: (a) delaying a first clock signal to produce a first delayed clock signal; (b) delaying the first delayed clock signal by a pulse width of a first logic state of the first clock signal under the control of a toss control signal generated from a second clock signal; and (c) mixing the clock signal from step (b) and one of the first and second clock signals.

In accordance with another aspect of the present invention, there is provided a duty cycle correction method for use in a semiconductor memory device including the steps of: (a) delaying a first clock signal to produce a first delayed clock signal; (b) delaying the first delayed clock signal by a pulse width of a first logic state of the first delayed clock signal under the control of a toss control signal arranged at a rising edge of a first logic state of a second clock signal, which is a complementary signal of the first clock signal, to produce a delay line output clock signal arranged at a falling edge of a first logic state of the first delayed clock; and (c) mixing a delay line output inversion clock signal inverted from the delay line output clock signal and the first clock signal.

In accordance with another aspect of the present invention, there is provided a semiconductor memory device having a delay lock loop (DLL) including a delay line unit for delaying a first clock signal related to a DLL output clock signal from the DLL, to produce a first delayed clock signal; an output tap unit to delay the first delayed clock signal by a pulse width of a first logic state of the first clock signal under the control of a toss control signal derived from a second clock signal; a phase mixer to mix the clock signal from the output tap unit and one of the first and second clock signals; a phase comparator that compares a phase of a duty cycle correction output clock signal with that of a duty cycle correction feedback clock signal outputted from the phase mixer, to provide phase comparison signals; and a phase mixer controller that counts the number of the phase comparison signals based on the second clock signal to generate phase control signals.

In accordance with another aspect of the present invention, there is provided a semiconductor memory device having a delay lock loop (DLL) including a delay line block that delays a first clock signal related to a DLL output clock signal from the DLL, to produce a first delayed clock signal; an output tap unit for delaying the first delayed clock signal by a pulse width of a second logic state of the first delayed clock signal, under the control of a toss control signal arranged at a rising edge of a first logic state of a second clock signal which is a complementary signal of the first clock signal, to produce a delay line output clock signal arranged at a falling edge of a first logic state of the first delayed clock signal; a phase mixer that mixes a delay line output inversion clock signal inverted from the delay line output clock signal and the first clock signal; a phase comparator that compares a phase of a duty cycle correction output clock signal with that of a duty cycle correction feedback clock signal outputted from the phase mixer, to provide phase comparison signals; and a phase mixer controller that counts the number of the phase comparison signals, based on the second clock signal to generate phase control signals.

In accordance with another aspect of the present invention, there is provided a semiconductor memory device comprising a delay lock loop (DLL) having an input buffering block to buffer an externally input second clock signal, wherein the input buffering block includes: a delay line unit to delay a first clock signal, which is a complementary signal of the second clock signal, to produce a first delayed clock signal; an output tap unit to delay the first delayed clock signal by a pulse width of a first logic state of the first clock signal under the control of a toss control signal generated from the second clock signal; a phase mixer to mix the clock signal from the output tap unit and one of the first and second clock signals; a phase comparator that compares a phase of a duty cycle correction output clock signal with that of a duty cycle correction feedback clock signal outputted from the phase mixer, to provide phase comparison signals; and a phase mixer controller that counts the number of the phase comparison signals, based on the second clock signal, to generate phase control signals.

In accordance with another aspect of the present invention, there is provided a semiconductor memory device comprising a delay lock loop (DLL) having an input buffering block to buffer an externally input second clock signal, wherein the input buffering block includes: a delay line unit that delays a first clock signal, which is a complementary signal of the second clock signal, to produce a first delayed clock signal; an output tap unit that delays the first delayed clock signal by a pulse width of a first logic state of the first delayed clock signal, under the control of a toss control signal arranged at a rising edge of a first logic state of the second clock signal, to produce a delay line output clock signal arranged at a falling edge of a pulse of a first logic state of the first delayed clock signal; a phase mixer to mix a delay line output inversion clock signal inverted from the delay line output clock signal and the first clock signal; a phase comparator that compares a phase of a duty cycle correction output clock signal with that of a duty cycle correction feedback clock signal outputted from the phase mixer, to provide phase comparison signals; and a phase mixer controller that counts the number of the phase comparison signals based on the second clock signal to generate phase control signals.

In accordance with another aspect of the present invention, there is provided a semiconductor memory device having a delay lock loop (DLL) including an input buffer to buffer an externally input second clock signal; a delay line unit for delaying a first clock signal, which is a complementary signal of the second clock signal, to produce a first delayed clock signal; an output tap unit for delaying the first delayed clock signal by a pulse width of a first logic state of the first clock signal under the control of a toss control signal generated corresponding to the second clock signal; a phase mixer that mixes the clock signal from the output tap unit and one of the first and second clock signals, to thereby output a mixed clock signal onto a delay line within the DLL; a phase comparator that compares a phase of a duty cycle correction output clock signal with that of a duty cycle correction feedback clock signal, outputted from the phase mixer, to provide phase comparison signals; and a phase mixer controller that counts the number of the phase comparison signals based on the second clock signal to generate phase control signals.

In accordance with another aspect of the present invention, there is provided a semiconductor memory device having a delay lock loop (DLL) including an input buffer that buffers a second clock signal inputted from outside; a delay line unit for delaying a first clock signal, which is a complementary signal of the second clock signal, to produce a first delayed clock signal; an output tap unit that delays the first delayed clock signal by a pulse width of a first logic state of the first delayed clock signal, under the control of a toss control signal arranged at a rising edge of a first logic state of the second clock signal, to produce a delay line output clock signal arranged at a falling edge of a pulse of a first logic state of the first delayed clock signal; a phase mixer that mixes the clock signal from the output tap unit and one of the first and second clock signals, to thereby output a mixed clock signal onto a delay line within the DLL; a phase comparator that compares a phase of a duty cycle correction output clock signal with that of a duty cycle correction feedback clock signal outputted from the phase mixer, to provide phase comparison signals; and a phase mixer controller that counts the number of the phase comparison signals based on the second clock signal to generate phase control signals.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Hereinafter, semiconductor memory devices in accordance with embodiments of the present invention are described in detail, with reference to the accompanying drawings.

Figure 1:
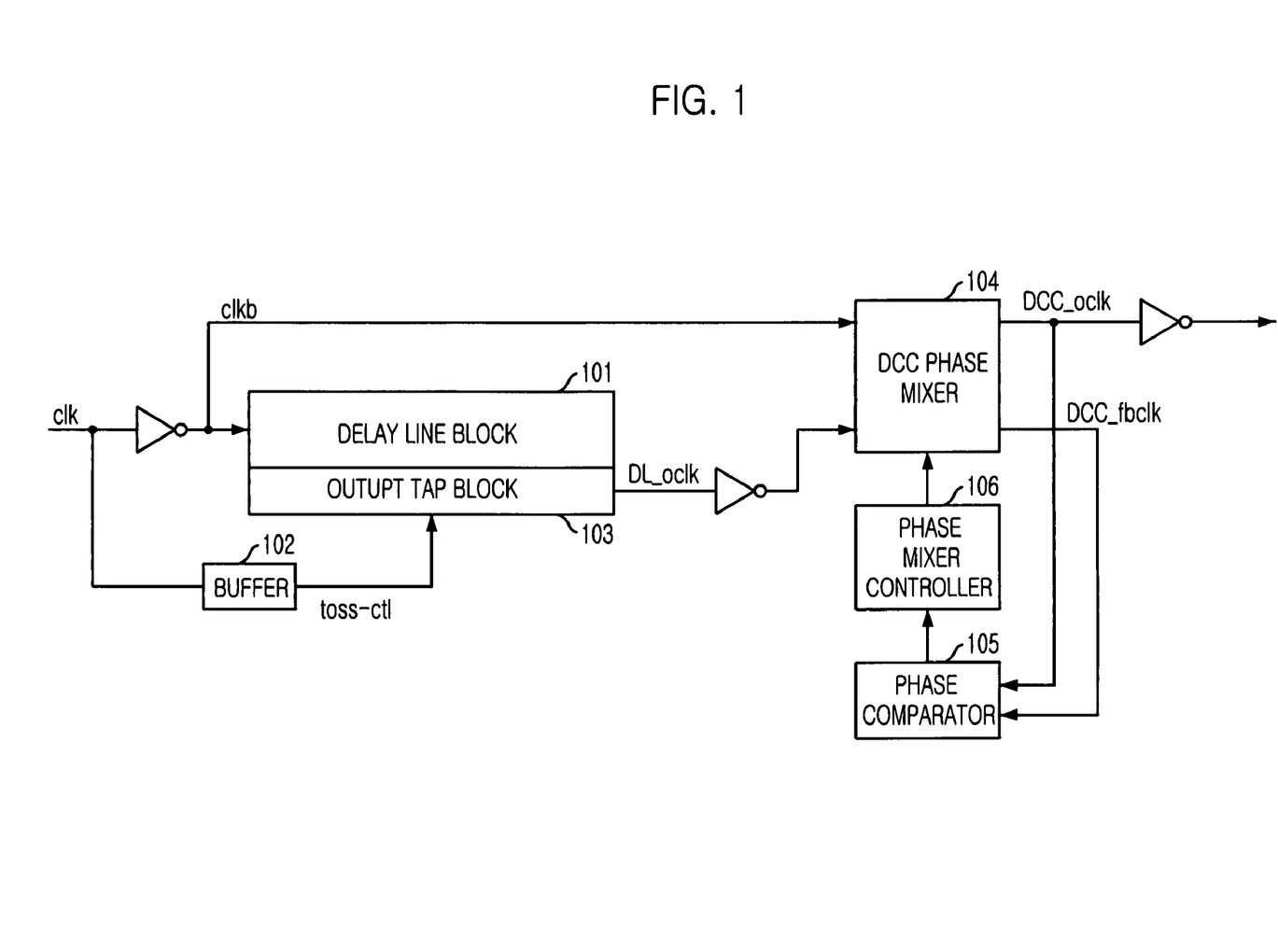
FIG. 1 is a block diagram showing a duty cycle correction device in accordance with one embodiment of the present invention.
Figure 2:
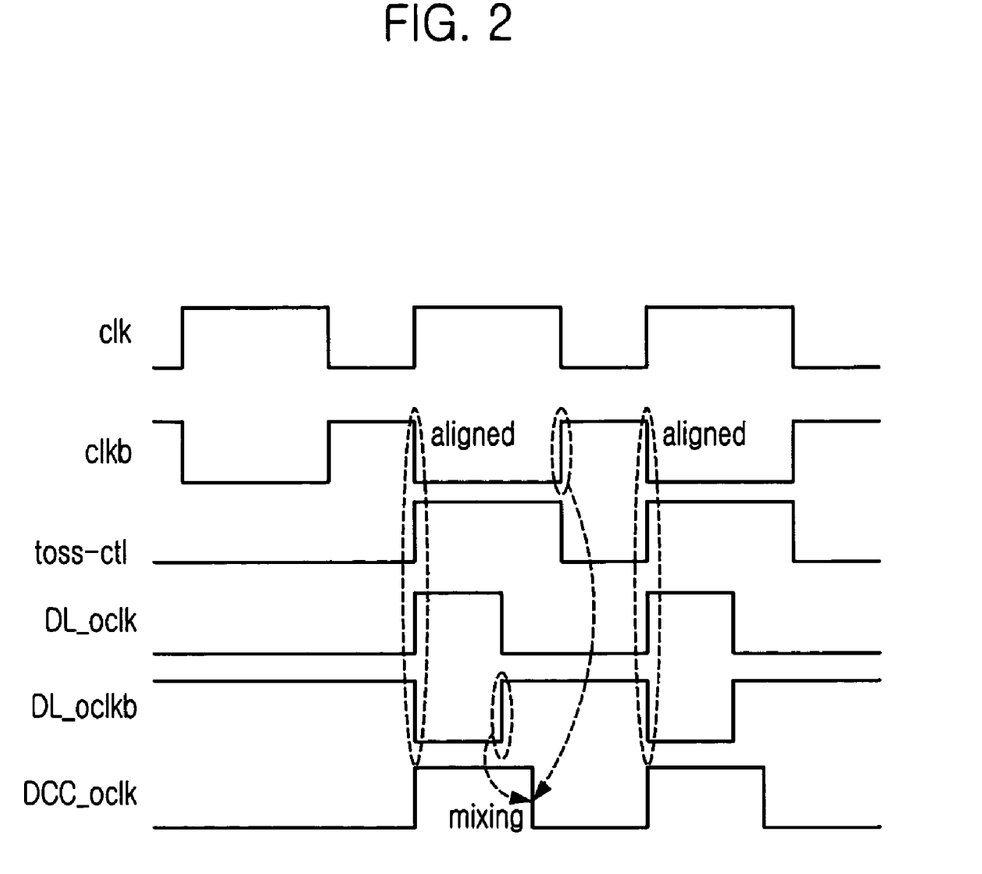
FIG. 2 is a timing diagram describing an operation of the duty cycle correction device shown in FIG. 1.

FIG. 1 is a block diagram showing a duty cycle correction device in accordance with one embodiment of the present invention, and FIG. 2 is a timing diagram describing an operation of the duty cycle correction device shown in FIG. 1.

The duty cycle correction device in accordance with the present invention comprises a delay line block 101, a buffer 102, an output tap block 103, a DCC phase mixer 104, a phase mixer controller 106 and a phase comparator 105.

Specifically, delay line block 101 delays for a certain interval an external inversion clock signal clkb inverted from an external clock signal clk by an inverter. In the meantime, buffer 102 buffers external clock signal clk to thereby output a toss control signal toss-ctl.

Thereafter, output tap block 103 delays a phase of the external inversion clock signal clkb progressing along a delay line within delay line block 101 by a width of "H" pulse of clock signal clkb, in response to toss control signal toss-ctl from buffer 102, to provide a delay line output clock signal DL_oclk.

DCC phase mixer 104 corrects a duty of the external clock signal clk using external inversion clock signal clkb and a delay line output inversion clock signal DL_oclkb that is obtained by inverting delay line output clock signal DL_oclk. Phase comparator 105 compares a phase of a DCC output clock signal DCC_oclk with that of a DCC feedback clock signal DCC_fbclk from DCC phase mixer 104. Based on the comparison result at phase comparator 105, phase mixer controller 106 outputs a signal for controlling a phase of the clock signal to DCC phase mixer 104.

If the external inversion clock signal clkb is provided from a duty cycle correction device according to another embodiment of the present invention (not shown), then delay line block 101 delays external clock signal clk and buffer 102 buffers external inversion clock signal clkb to output toss control signal toss-ctl. At this time, DCC phase mixer 104 can input external clock signal clk and delay line output clock signal DL_oclk and mix phases of both clock signals. In this case, an output clock from DCC phase mixer 104 is the reverse of a phase of the clock signal DCC_oclk shown in FIG. 2.

Figure 3:
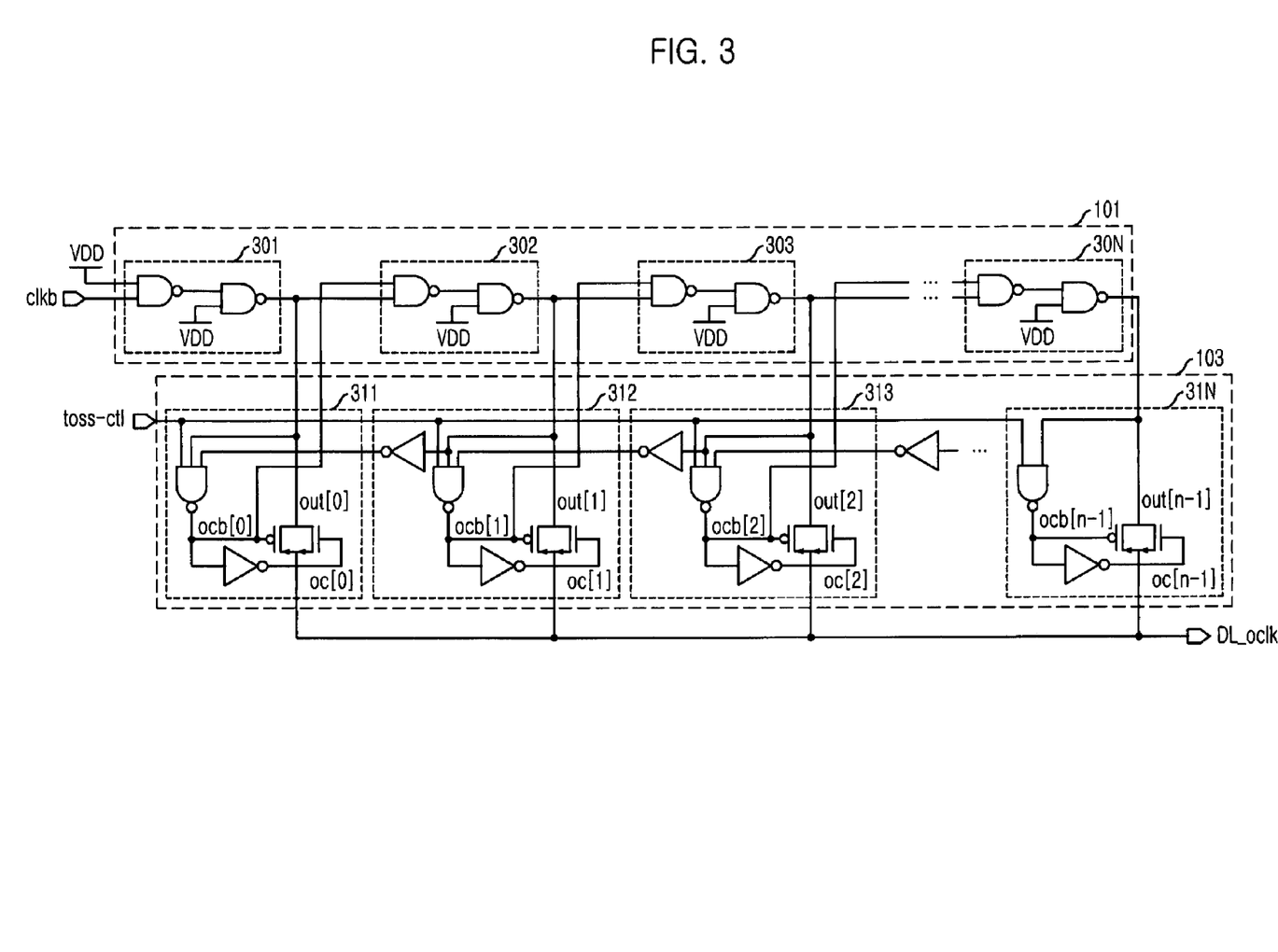
FIG. 3 is a circuit diagram showing exemplary implementations for a delay line block and an output tap block shown in FIG. 1.

FIG. 3 is a circuit diagram showing an exemplary implementation for delay line block 101 and output tap block 103 of FIG. 1.

As shown, output tap block 103, in response to the toss control signal toss-ctl from buffer 102, delays a phase of external inversion clock signal clkb propagating along a delay line within delay line block 101 by "H" pulse width of clock signal clkb, and generates delay line output clock signal DL_oclk. That is, during the external inversion clock signal clkb of rising edge moves along the delay line within delay line block 101. When the toss control signal toss-ctl is transited to a logic "H," the signal clkb can be outputted to output tap block 103. According to one embodiment of the invention shown in FIG. 1, an inverter can be coupled to an output port of output tap block 103. Further, according to another embodiment of the present invention, it can also be embedded within output tap block 103. According to still another embodiment of the invention, the inverter can be installed within phase mixer 104. It should be noted that even though there are presented only several embodiments, as above, for simplification, the invention is not limited to those embodiments.

In the duty cycle correction device, toss control signal toss-ctl can be a signal arranged at a rising edge of the "H" pulse of the external clock signal clk. Further, according to another embodiment of the invention, toss control signal toss-ctl can be a signal arranged at a falling edge of the "H" pulse of the external inversion clock signal clkb. Moreover, referring to FIG. 2, a pulse width of toss control signal toss-ctl is substantially identical to that of external clock signal clk. When toss control signal toss-ctl is arranged at a rising edge of "H" pulse of the external clock signal clk, the toss control signal can be enabled to a logic "H" state. If the toss control signal toss-ctl is logic "L" state, then outputs of 3 input NAND gates constituting respective output taps within output tap block 103 are all in logic "H" state. According to the above, external inversion clock signal clkb propagates within delay line block 101. By the progress of external inversion clock signal clkb, an output of the delay line transitions from logic "L" state to logic "H" state. The operation of a unit delay cell (hereinafter, referred as "UDC") within line delay block 101 and individual output taps within output tap block 103 are described with reference to Table. 1 below:

TABLE 1

| No. of UDC | | 301 | 302 | 303 |
|---|---|---|---|---|
| Timing | | t − 1 | T | t + 1 |
| 3-input of NAND gate | toss-ctl | H | H | H |
| | Present UDC | H | H | L |
| | Inverting the Next UDC | L | H | L |

As can be seen from Table. 1, if the rising edge of the external inversion clock signal clkb passes through a present UDC 302, the output of 3-input NAND gate becomes logic state "L". The output of the 3-input NAND gate turns on a transmission gate within an output tap 312, and then is provided as the delay line output clock signal DL_oclk. Consequently, the rising edge of the delay line output clock signal DL_oclk can be synchronized with the falling edge of the external clock signal clk.

In accordance with this aspect of the present invention, DCC phase mixer 104 mixes a phase of the external inversion clock clkb and that of delay line output inversion clock signal DL_oclk inverted from delay line output clock signal DL_oclk, thereby correcting a duty of external clock signal clk.

Further, in accordance with another embodiment of the invention, DCC mixer 104 can receive external clock signal clk and delay line output clock signal DL_oclk and mix phases of the both clock signals. In this case, the output clock signal from DCC phase mixer 104 is a complementary one of the clock shown in FIG. 2.

However, since, with only the structure as described above, the desirable output cannot be derived from DCC phase mixer 104, it is preferable that the duty cycle correction device in accordance with the exemplary embodiment of the invention described herein comprises phase comparator 105 and phase mixer controller 106.

Figure 5:
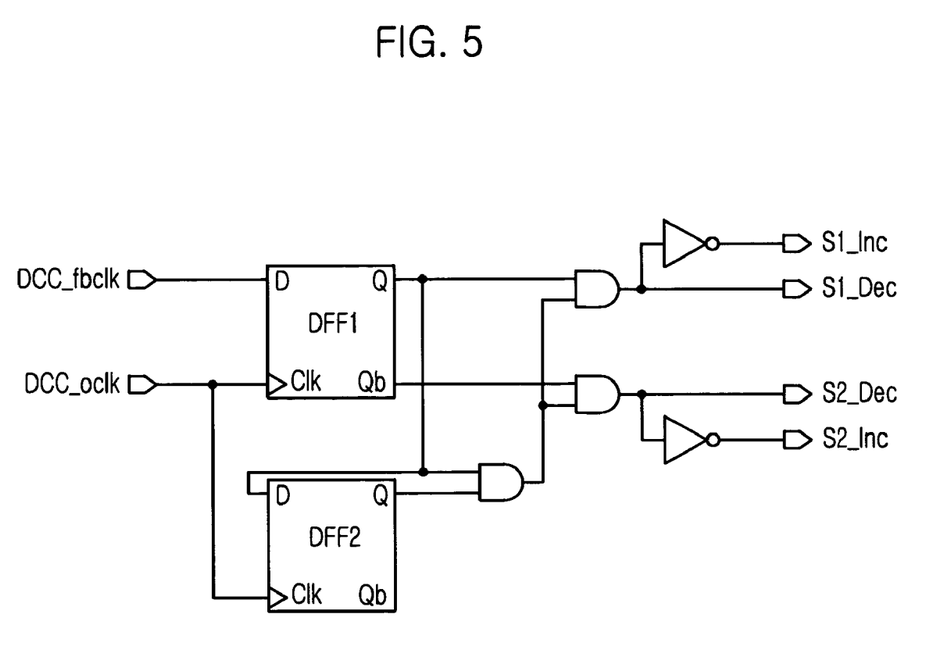
FIG. 5 is a detailed circuit diagram depicting an exemplary implementation for a phase comparator shown in FIG. 1.

FIG. 5 is a detailed circuit diagram depicting an exemplary implementation for phase comparator 105 shown in FIG. 1.

As shown, phase comparator 105 of the present invention compares a phase of DCC output clock signal DCC_oclk with that of DCC feedback clock signal DCC_fbclk from phase mixer 104, to output phase comparison signals, s1_Inc, s1_Dec, s2_Inc and s2_Dec. If a duty ratio of external clock signal clk is larger than 50%, then a phase of a rising edge of DCC output clock signal DCC_oclk lags behind a rising edge of the DCC feedback clock. In this case, phase comparator 105 causes a phase control signal s1 to increase and phase control signal s2 to decrease. But if the duty ratio of the external clock signal clk is smaller than 50%, then a phase of a rising edge of the DCC output clock signal DCC_oclk precedes a rising edge of the DCC feedback clock DCC_fbclk. In this case, phase comparator 105 allows phase control signal s1 to decrease and phase control signal s2 to increase.

Figure 4:
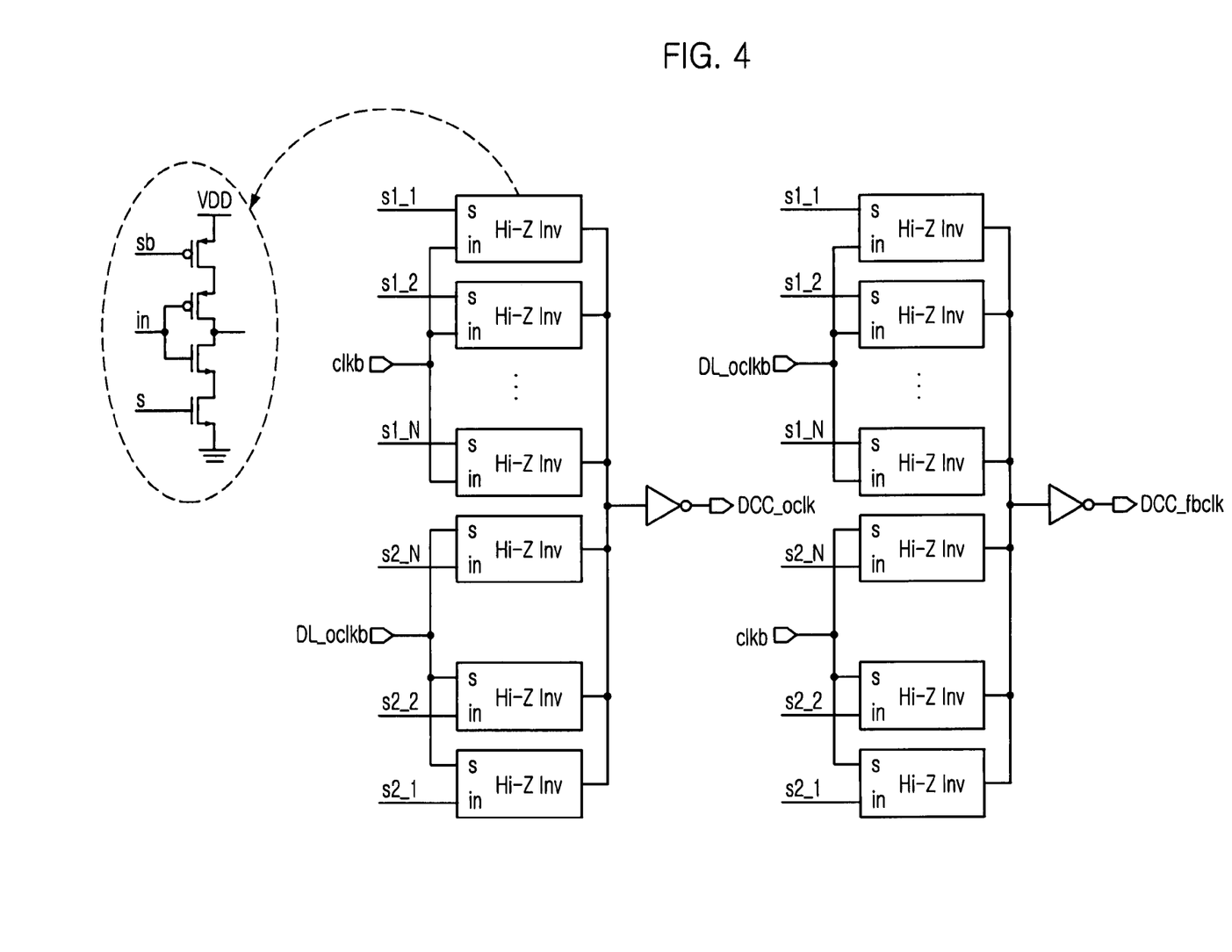
FIG. 4 is a detailed circuit diagram showing an exemplary implementation for a DCC phase mixer shown in FIG. 1.
Figure 6:
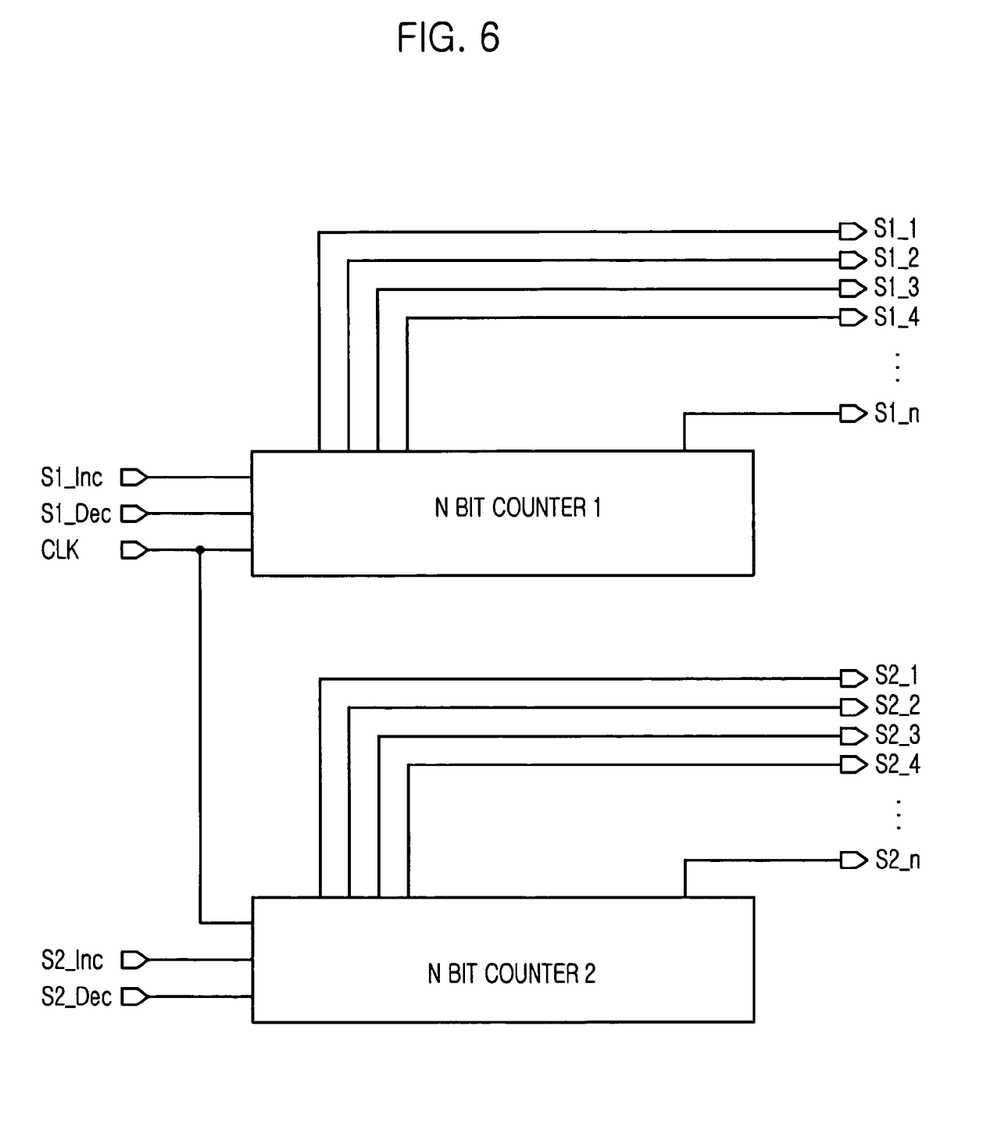
FIG. 6 is a detailed circuit diagram showing an exemplary implementation for the phase mixer controller shown in FIG. 1.

Phase mixer controller 106, as shown in FIG. 6, can comprise a plurality of counters of N bits which output phase control signals, s1_1 to s1_N and s2_1 to s2_N, by counting the clock being inputted, using the phase comparison signals, s1_Inc, s1_Dec, s2_Inc and s2_Dec. That is, it sequentially increases and decreases the number of phase control signals, s1_1 to s1_N, activated by the phase comparison signals, s1_Inc and s1_Dec. In the same manner, it sequentially increases and decreases the number of phase control signals, s2_1 to s2_N, activated in response to the phase comparison signals s2_Inc and s2_Dec. Thereafter, as shown in FIG. 4, DCC phase mixer 104 can mix the phase of the external inversion clock signal clkb and that of the delay line output inversion clock signal DL_oclkb.

Now, concrete operational examples in accordance with present invention are presented below. First, assume that the phase of external inversion clock signal clkb comes before that of delay line output inversion clock signal DL_oclkb. Due to the phase difference, the first counter in phase mixer controller 106 activates first to third upper phase control signals, s1_1 to s1_3, and the second counter activates a first lower phase control signal s2_1. After doing so, DCC phase mixer 104 shown in FIG. 4 mixes the phase of external inversion clock signal clkb and the phase of delay line output inversion clock signal DL_oclkb by the high impedance inverter. This generates a mixed clock signal at a position of ¼ from the preceding clock signal.

In the meantime, as another embodiment of the phase mixer controller 106, can be designed in a manner such that any one of the phase control signals, s1_1 to s1_N, is activated and any one of the phase control signals, s2_1 to s2_N, is activated. For this, the high-impedance inverters in DCC phase mixer 104 of FIG. 4 must be designed at a different size. In other words, because the phase difference is large, the size of the high-impedance inverters turned-on in response to the phase control signals becomes large. Further, there is a method that can be used that combines a plurality of high-impedance inverters in serial and parallel, while maintaining the size of the high-impedance inverters in the DCC phase mixer 104 of FIG. 4 identically. In the above embodiment, there can be further methods where the high-impedance inverters in DCC phase mixer 104 are designed in a different sizes. However, their detailed descriptions are omitted herein for simplification.

Figure 7:
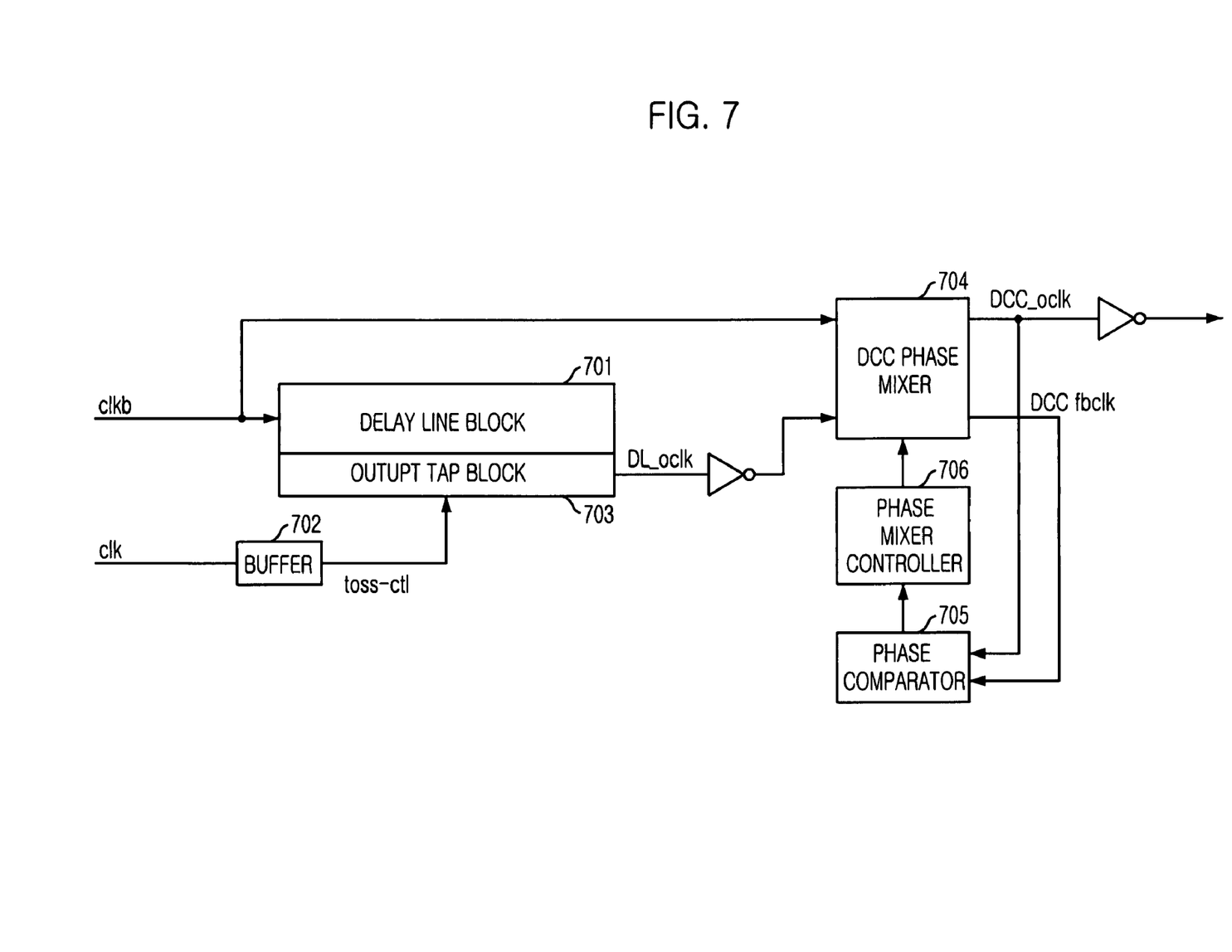
FIG. 7 is a block diagram showing a duty cycle correction device in accordance with another embodiment of the present invention.

FIG. 7 is a block diagram showing a duty cycle correction device in accordance with another embodiment of the present invention, wherein the input signal is different from the embodiment shown in FIG. 1. That is to say, as shown in another embodiment of FIG. 7, the external clock signal clk and the inversion clock signal clkb are received directly from the outside.

A duty cycle correction device of the present invention having such configuration can be operated by a connection with an output port of the delay lock loop. Otherwise, the inventive duty cycle correction device can be operated by a connection with an input port of the delay lock loop. That is, it can be employed in the clock input buffer. Alternatively, the inventive duty cycle correction device can be operated by positioning it between the clock input buffer and the delay lock loop.

As a result, the present invention can considerably reduce the size of duty cycle correction devices while reducing power consumption. Further, the invention can considerably decrease time taken to perform duty cycle correction. In other words, the duty cycle correction operation using a conventional delay lock loop is made during a stable period of approximately dozens to 200 cycles. However, according to the duty cycle correction device of the present invention employing the novel delay lock loop, the correction operation can be made during only a single cycle.

The present application contains subject matter related to Korean patent application No. 2004-28975, filed in the Korean Patent Office on Apr. 27, 2004, the entire contents of which are incorporated herein by reference.

As described above, although the present invention is explained by specific embodiments and drawings, those skilled in the art will appreciate that various modifications, additions and substitutions are possible, without departing from the scope and spirit of the invention as disclosed in the accompanying claims.

What is claimed is:

1. A duty cycle correction apparatus for use in a semiconductor memory device, comprising:
   a delay line unit for delaying a first clock signal to produce a first delayed clock signal;
   an output tap unit for delaying the first delayed clock signal by a pulse width of a first logic state of the first clock signal under the control of a toss control signal derived from a second clock signal; and
   a phase mixer for mixing the clock signal from the output tap unit and one of the first and second clock signals,
   wherein the first clock signal is a complementary signal of the second clock signal, and the phase mixer mixes a delay line output inversion clock signal and the first clock signal, the delay line output inversion clock signal being obtained by delaying the first delayed clock signal by a pulse width of the first logic state of the first clock signal and then inverting the delayed clock signal.

2. The duty cycle correction apparatus as recited in claim 1, wherein the first clock signal is a complementary signal of the second clock signal, and the phase mixer mixes a delay line output clock signal and the second clock signal, the delay line output clock signal being obtained by delaying the first delayed clock signal by a pulse width of the first logic state of the first clock signal.

3. The duty cycle correction apparatus as recited in claim 1 further comprising:
   a phase comparator for comparing a phase of a duty cycle correction output clock signal with that of a duty cycle correction feedback clock signal, outputted from the phase mixer, to provide phase comparison signals; and
   a phase mixer controller for counting the number of the phase comparison signals based on the second clock signal to generate phase control signals.

4. The duty cycle correction apparatus as recited in claim 3, wherein, if a phase of the duty cycle correction output clock signal lags behind that of the duty cycle correction feedback clock signal, the phase comparator makes a first increase signal and a second decrease signal included in each the phase comparison signals to be activated, said each phase comparison signal containing the first increase signal and the second decrease signal, a first decrease signal and a second increase signal.

5. The duty cycle correction apparatus as recited in claim 4, wherein the phase mixer controller includes:
   a first counter for counting the second clock signal using the first increase signal and the first decrease signal and producing a plurality of first phase control signals; and
   a second counter for counting the second clock signal using the second increase signal and the second decrease signal and outputting a plurality of second phase control signals.

6. The duty cycle correction apparatus as recited in claim 5, wherein the first counter sequentially increases and decreases the number of one or more first phase control signals, activated in response to the first increase signal and the first decrease signal, among the plurality of first phase control signals, and
   the second counter sequentially increases and decreases the number of one or more second phase control signals, activated in response the second increase signal and the second decrease signal, among the plurality of second phase control signals.

7. The duty cycle correction apparatus as recited in claim 6, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
   each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

8. The duty cycle correction apparatus as recited in claim 7, wherein the first and the second parallel high impedance inverters carry an identical amount of current, respectively.

9. The duty cycle correction apparatus as recited in claim 5, wherein the first counter activates one of the plurality of first phase control signals, which corresponds to the first increase signal and the first decrease signal, and
   the second counter activates one of the plurality of second phase control signals, which corresponds to the second increase signal and the second decrease signal.

10. The duty cycle correction apparatus as recited in claim 9, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
    each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

11. The duty cycle correction apparatus as recited in claim 10, wherein the first parallel high impedance inverters carry a different amount of current, respectively.

12. A duty cycle correction apparatus for use in a semiconductor memory device comprising:
    a delay line unit for delaying a first clock signal to produce a first delayed clock signal;
    an output tap unit for delaying the first delayed clock signal by a pulse width of a first logic state of the first delayed clock signal, under the control of a toss control signal arranged at a rising edge of a first logic state of a second clock signal which is a complementary signal of the first clock signal, to produce a delay line output clock signal arranged at a falling edge of a first logic state of the first delayed clock signal;
    a phase mixer for mixing a delay line output inversion clock signal inverted from the delay line output clock signal and the first clock signal;
    a phase comparator for comparing a phase of a duty cycle correction output clock signal with that of a duty cycle correction feedback clock signal, outputted from the phase mixer, to provide phase comparison signals; and
    a phase mixer controller for counting the number of the phase comparison signals based on the second clock signal to generate phase control signals.

13. The duty cycle correction apparatus as recited in claim 12, wherein, if a phase of a rising edge of the duty cycle correction output clock signal lies behind that of the duty cycle correction feedback clock signal, the phase comparator makes a first increase signal and a second decrease signal included in each the phase comparison signals to be activated, said each phase comparison signal containing the first increase signal and the second decrease signal, a first decrease signal and a second increase signal.

14. The duty cycle correction apparatus as recited in claim 13, wherein the phase mixer controller includes:
    a first counter for counting the second clock signal using the first increase signal and the first decrease signal and producing a plurality of first phase control signals; and
    a second counter for counting the second clock signal using the second increase signal and the second decrease signal and outputting a plurality of second phase control signals.

15. The duty cycle correction apparatus as recited in claim 14, wherein the first counter sequentially increases and decreases the number of one or more first phase control signals, activated in response to the first increase signal and the first decrease signal, among the plurality of first phase control signals, and
    the second counter sequentially increases and decreases the number of one or more second phase control signals, activated in response the second increase signal and the second decrease signal, among the plurality of second phase control signals.

16. The duty cycle correction apparatus as recited in claim 15, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
    each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

17. The duty cycle correction apparatus as recited in claim 16, wherein the first and the second parallel high impedance inverters carry an identical amount of current, respectively.

18. The duty cycle correction apparatus as recited in claim 14, wherein the first counter activates one of the plurality of first phase control signals, which corresponds to the first increase signal and the first decrease signal, and the second counter activates one of the plurality of second phase control signals, which corresponds to the second increase signal and the second decrease signal.

19. The duty cycle correction apparatus as recited in claim 18, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

20. The duty cycle correction apparatus as recited in claim 19, wherein the first parallel high impedance parallel inverters carry a different amount of current, respectively.

21. A duty cycle correction method for use in a semiconductor memory device comprising the steps of:
(a) delaying a first clock signal to produce a first delayed clock signal;
(b) delaying the first delayed clock signal by a pulse width of a first logic state of the first clock signal under the control of a toss control signal generated from a second clock signal; and
(c) mixing the clock signal from the step (b) and one of the first and second clock signals;
wherein the first clock signal is a complementary signal of the second clock signal, and the step (c) mixes a delay line output inversion clock signal and the first clock signal, the delay line output inversion clock signal being obtained by delaying the first delayed clock signal by a pulse width of the first logic state of the first clock signal and then inverting the delayed clock signal.

22. The duty cycle correction method as recited in claim 21, wherein the first clock signal is a complementary signal of the second clock signal, and the step (c) mixes a delay line output clock signal and the second clock signal, the delay line output clock signal being obtained by delaying the first delayed clock signal by a pulse width of the first logic state of the first clock signal.

23. The duty cycle correction method as recited in claim 21, further comprising the steps of:
(d) comparing a phase of a duty cycle correction output clock signal with that of a duty cycle correction feedback clock signal, outputted from the step (c), to provide phase comparison signals; and
(e) counting the number of the phase comparison signals based on the second clock signal to generate phase control signals.

24. A duty cycle correction method for use in a semiconductor memory device comprising the steps of:
(a) delaying a first clock signal to produce a first delayed clock signal;
(b) delaying the first delayed clock signal by a pulse width of a first logic state of the first delayed clock signal, under the control of a toss control signal arranged at a rising edge of a first logic state of a second clock signal which is a complementary signal of the first clock signal, to produce a delay line output clock signal arranged at a falling edge of a first logic state of the first delayed clock;
(c) mixing a delay line output inversion clock signal inverted from the delay line output clock signal and the first clock signal;

(d) comparing a phase of a duty cycle correction output clock signal with that of a duty cycle correction feedback clock signal, outputted from the step (c), to provide phase comparison signals; and
(e) counting the number of the phase comparison signals based on the second clock signal to generate phase control signals.

25. The duty cycle correction method as recited in claim 24, wherein, if a phase of a rising edge of the duty cycle correction output clock signal lags behind that of the duty cycle correction feedback clock signal, the step (d) makes a first increase signal and a second decrease signal included in each the phase comparison signals to be activated, said each phase comparison signal containing the first increase signal and the second decrease signal, a first decrease signal and a second increase signal.

26. The duty cycle correction method as recited in claim 25, wherein the step (e) includes the steps of:
(f) counting the second clock signal using the first increase signal and the first decrease signal and producing a plurality of first phase control signals; and
(g) counting the second clock signal using the second increase signal and the second decrease signal and outputting a plurality of second phase control signals.

27. The duty cycle correction method as recited in claim 26, wherein the step (f) sequentially increases and decreases the number of one or more first phase control signals, activated in response to the first increase signal and the first decrease signal, among the plurality of first phase control signals, and
the step (g) sequentially increases and decreases the number of one or more second phase control signals, activated in response the second increase signal and the second decrease signal, among the plurality of second phase control signals.

28. The duty cycle correction method as recited in claim 26, wherein the step (f) activates one of the plurality of first phase control signals, which corresponds to the first increase signal and the first decrease signal, and
the step (g) activates one of the plurality of second phase control signals, which corresponds to the second increase signal and the second decrease signal.

29. A semiconductor memory device having a delay lock loop (DLL) comprising:
a delay line unit for delaying a first clock signal related to a DLL output clock signal from the DLL, to produce a first delayed clock signal;
an output tap unit for delaying the first delayed clock signal by a pulse width of a first logic state of the first clock signal under the control of a toss control signal derived from a second clock signal;
a phase mixer for mixing the clock signal from the output tap unit and one of the first and second clock signals;
a phase comparator for comparing a phase of a duty cycle correction output clock signal with that of a duty cycle correction feedback clock signal, outputted from the phase mixer, to provide phase comparison signals; and
a phase mixer controller for counting the number of the phase comparison signals based on the second clock signal to generate phase control signals.

30. The semiconductor memory device as recited in claim 29, wherein the first clock signal is a complementary signal of the second clock signal, and the phase mixer mixes a delay line output inversion clock signal and the first clock signal, the delay line output inversion clock signal being obtained by delaying the first delayed clock signal by a pulse width of the first logic state of the first clock signal and then inverting the delayed clock signal.

31. The semiconductor memory device as recited in claim 29, wherein the first clock signal is a complementary signal of the second clock signal, and the phase mixer mixes a delay line output clock signal and the second clock signal, the delay line output clock signal being obtained by delaying the first delayed clock signal by a pulse width of the first logic state of the first clock signal.

32. A semiconductor memory device having a delay lock loop (DLL) comprising:
   a delay line means for delaying a first clock signal related to a DLL output clock signal from the DLL, to produce a first delayed clock signal;
   an output tap unit for delaying the first delayed clock signal by a pulse width of a second logic state of the first delayed clock signal, under the control of a toss control signal arranged at a rising edge of a first logic state of a second clock signal which is a complementary signal of the first clock signal, to produce a delay line output clock signal arranged at a falling edge of a first logic state of the first delayed clock signal;
   a phase mixer for mixing a delay line output inversion clock signal inverted from the delay line output clock signal and the first clock signal;
   a phase comparator for comparing a phase of a duty cycle correction output clock signal with that of a duty cycle correction feedback clock signal, outputted from the phase mixer, to provide phase comparison signals; and
   a phase mixer controller for counting the number of the phase comparison signals based on the second clock signal to generate phase control signals.

33. The semiconductor memory device as recited in any one of claims 29, 30, and 31, wherein, if a phase of the duty cycle correction output clock signal lies behind that of the duty cycle correction feedback clock signal, the phase comparator makes a first increase signal and a second decrease signal included in each the phase comparison signals to be activated, said each phase comparison signal containing the first increase signal and the second decrease signal, a first decrease signal and a second increase signal.

34. The semiconductor memory device as recited in claim 33, wherein the phase mixer controller includes:
   a first counter for counting the second clock signal using the first increase signal and the first decrease signal and producing a plurality of first phase control signals; and
   a second counter for counting the second clock signal using the second increase signal and the second decrease signal and outputting a plurality of second phase control signals.

35. The semiconductor memory device as recited in claim 34, wherein the first counter sequentially increases and decreases the number of one or more first phase control signals, activated in response to the first increase signal and the first decrease signal, among the plurality of first phase control signals, and
   the second counter sequentially increases and decreases the number of one or more second phase control signals, activated in response the second increase signal and the second decrease signal, among the plurality of second phase control signals.

36. The semiconductor memory device as recited in claim 35, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
   each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

37. The semiconductor memory device as recited in claim 36, wherein the first and the second parallel high impedance inverters carry an identical amount of current, respectively.

38. The semiconductor memory device as recited in claim 34, wherein the first counter activates one of the plurality of first phase control signals, which corresponds to the first increase signal and the first decrease signal, and
   the second counter activates one of the plurality of second phase control signals, which corresponds to the second increase signal and the second decrease signal.

39. The semiconductor memory device as recited in claim 38, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
   each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

40. The semiconductor memory device as recited in claim 39, wherein the first parallel high impedance inverters carry a different amount of current, respectively.

41. A semiconductor memory device comprising a delay lock loop (DLL) having an input buffering means for buffering a second clock signal being inputted from the outside,
   wherein the input buffering means includes:
   a delay line unit for delaying a first clock signal which is a complementary signal of the second clock signal, to produce a first delayed clock signal;
   an output tap unit for delaying the first delayed clock signal by a pulse width of a first logic state of the first clock signal under the control of a toss control signal generated from the second clock signal;
   a phase mixer for mixing the clock signal from the output tap unit and one of the first and second clock signals;
   a phase comparator for comparing a phase of a duty cycle correction output clock signal with that of a duty cycle correction feedback clock signal, outputted from the phase mixer, to provide phase comparison signals; and
   a phase mixer controller for counting the number of the phase comparison signals based on the second clock signal to generate phase control signals.

42. The semiconductor memory device as recited in claim 41, wherein the first clock signal is a complementary signal of the second clock signal, and the phase mixer mixes a delay line output inversion clock signal and the first clock signal, the delay line output inversion clock signal being obtained by delaying the first delayed clock signal by a pulse width of the first logic state of the first clock signal and then inverting the delayed clock signal.

43. The semiconductor memory device as recited in claim 41, wherein the first clock signal is a complementary signal of the second clock signal, and the phase mixer mixes a delay line output clock signal and the second clock signal, the delay line output clock signal being obtained by delaying the first delayed clock signal by a pulse width of the first logic state of the first clock signal.

44. A semiconductor memory device comprising a delay lock loop (DLL) having an input buffering means for buffering a second clock signal being inputted from the outside,
wherein the input buffering means includes:
a delay line unit for delaying a first clock signal which is a complementary signal of the second clock signal, to produce a first delayed clock signal;
an output tap unit for delaying the first delayed clock signal by a pulse width of a first logic state of the first delayed clock signal, under the control of a toss control signal arranged at a rising edge of a first logic state of the second clock signal, to produce a delay line output clock signal arranged at a falling edge of a pulse of a first logic state of the first delayed clock signal;
a phase mixer for mixing a delay line output inversion clock signal inverted from the delay line output clock signal and the first clock signal;
a phase comparator for comparing a phase of a duty cycle correction output clock signal with that of a duty cycle correction feedback clock signal, outputted from the phase mixer, to provide phase comparison signals; and
a phase mixer controller for counting the number of the phase comparison signals based on the second clock signal to generate phase control signals.

45. The semiconductor memory device as recited in any one of claims 41, 42, and 44, wherein, if a phase of the duty cycle correction output clock signal lags behind that of the duty cycle correction feedback clock signal, the phase comparator makes a first increase signal and a second decrease signal included in each the phase comparison signals to be activated, said each phase comparison signal containing the first increase signal and the second decrease signal, a first decrease signal and a second increase signal.

46. The semiconductor memory device as recited in claim 45, wherein the phase mixer controller includes:
a first counter for counting the second clock signal using the first increase signal and the first decrease signal and producing a plurality of first phase control signals; and
a second counter for counting the second clock signal using the second increase signal and the second decrease signal and outputting a plurality of second phase control signals.

47. The semiconductor memory device as recited in claim 46, wherein the first counter sequentially increases and decreases the number of one or more first phase control signals, activated in response to the first increase signal and the first decrease signal, among the plurality of first phase control signals, and
the second counter sequentially increases and decreases the number of one or more second phase control signals, activated in response the second increase signal and the second decrease signal, among the plurality of second phase control signals.

48. The semiconductor memory device as recited in claim 47, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

49. The semiconductor memory device as recited in claim 48, wherein the first and the second parallel high impedance inverters carry an identical amount of current, respectively.

50. The semiconductor memory device as recited in claim 46, wherein the first counter activates one of the plurality of first phase control signals, which corresponds to the first increase signal and the first decrease signal, and
the second counter activates one of the plurality of second phase control signals, which corresponds to the second increase signal and the second decrease signal.

51. The semiconductor memory device as recited in claim 50, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

52. The semiconductor memory device as recited in claim 51, wherein the first parallel high impedance inverters carry a different amount of current, respectively.

53. A semiconductor memory device having a delay lock loop (DLL) comprising:
an input buffer for buffering a second clock signal being inputted from the outside;
a delay line unit for delaying a first clock signal which is a complementary signal of the second clock signal, to produce a first delayed clock signal;
an output tap unit for delaying the first delayed clock signal by a pulse width of a first logic state of the first clock signal under the control of a toss control signal generated corresponding to the second clock signal;
a phase mixer for mixing the clock signal from the output tap unit and one of the first and second clock signals, to thereby output a mixed clock signal onto a delay line within the DLL;
a phase comparator for comparing a phase of a duty cycle correction output clock signal with that of a duty cycle correction feedback clock signal, outputted from the phase mixer, to provide phase comparison signals; and
a phase mixer controller for counting the number of the phase comparison signals based on the second clock signal to generate phase control signals.

54. The semiconductor memory device as recited in claim 53, wherein the first clock signal is a complementary signal of the second clock signal, and the phase mixer mixes a delay line output inversion clock signal and the first clock signal, the delay line output inversion clock signal being obtained by delaying the first delayed clock signal by a pulse width of the first logic state of the first clock signal and then inverting the delayed clock signal.

55. The semiconductor memory device as recited in claim 53, wherein the first clock signal is a complementary signal of the second clock signal, and the phase mixer mixes a delay line output clock signal and the second clock signal, the delay line output clock signal being obtained by delaying the first delayed clock signal by a pulse width of the first logic state of the first clock signal.

56. A semiconductor memory device having a delay lock loop (DLL) comprising:
an input buffer for buffering a second clock signal being inputted from outside;
a delay line unit for delaying a first clock signal which is a complementary signal of the second clock signal, to produce a first delayed clock signal;
an output tap unit for delaying the first delayed clock signal by a pulse width of a first logic state of the first delayed clock signal, under the control of a toss control signal arranged at a rising edge of a first logic state of the second clock signal, to produce a delay line output clock signal arranged at a falling edge of a pulse of a first logic state of the first delayed clock signal;
a phase mixer for mixing the clock signal from the output tap unit and one of the first and second clock signals, to thereby output a mixed clock signal onto a delay line within the DLL;
a phase comparator for comparing a phase of a duty cycle correction output clock signal with that of a duty cycle correction feedback clock signal, outputted from the phase mixer, to provide phase comparison signals; and
a phase mixer controller for counting the number of the phase comparison signals based on the second clock signal to generate phase control signals.

57. The semiconductor memory device as recited in any one of claims 53, 54, and 55, wherein, if a phase of the duty cycle correction output clock signal lies behind that of the duty cycle correction feedback clock signal, the phase comparator makes a first increase signal and a second decrease signal included in each the phase comparison signals to be activated, said each phase comparison signal containing the first increase signal and the second decrease signal, a first decrease signal and a second increase signal.

58. The semiconductor memory device as recited in claim 57, wherein the phase mixer controller includes:
a first counter for counting the second clock signal using the first increase signal and the first decrease signal and producing a plurality of first phase control signals; and
a second counter for counting the second clock signal using the second increase signal and the second decrease signal and outputting a plurality of second phase control signals.

59. The semiconductor memory device as recited in claim 58, wherein the first counter sequentially increases and decreases the number of one or more first phase control signals, activated in response to the first increase signal and the first decrease signal, among the plurality of first phase control signals, and
the second counter sequentially increases and decreases the number of one or more second phase control signals, activated in response the second increase signal and the second decrease signal, among the plurality of second phase control signals.

60. The semiconductor memory device as recited in claim 59, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

61. The semiconductor memory device as recited in claim 60, wherein the first and the second parallel high impedance inverters carry an identical amount of current, respectively.

62. The semiconductor memory device as recited in claim 58, wherein the first counter activates one of the plurality of first phase control signals, which corresponds to the first increase signal and the first decrease signal, and
the second counter activates one of the plurality of second phase control signals, which corresponds to the second increase signal and the second decrease signal.

63. The semiconductor memory device as recited in claim 62, wherein the phase mixer includes a first high impedance inverting port having first parallel high impedance inverters for inputting the first delayed clock signal, and a second high impedance inverting port having second parallel high impedance inverters for inputting the delay line output inversion clock signal, and
each of the first parallel high impedance inverters exclusively inputting one of the plurality of first phase control signals, each of the second parallel high impedance inverters exclusively inputting one of the plurality of second phase control signals, and outputs of the first and the second parallel high impedance inverters being coupled to a single node.

64. The semiconductor memory device as recited in claim 51, wherein the first parallel high impedance inverters carry a different amount of current, respectively.

* * * * *